US006954301B2

(12) United States Patent
Nguyen et al.

(10) Patent No.: US 6,954,301 B2
(45) Date of Patent: Oct. 11, 2005

(54) LOW-VOLTAGE ELECTROMECHANICAL DEVICE INCLUDING A TILTABLE MICROPLATFORM, METHOD OF TILTING SAME, ARRAY OF SUCH DEVICES AND METHOD OF SETTING DIMPLE-TO-SUBSTRATE SPACING

(75) Inventors: Clark T.-C. Nguyen, Arlington, VA (US); Yuan Xie, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 101 days.

(21) Appl. No.: 10/426,372

(22) Filed: Apr. 29, 2003

(65) Prior Publication Data
US 2004/0109222 A1 Jun. 10, 2004

Related U.S. Application Data
(60) Provisional application No. 60/376,639, filed on Apr. 30, 2002.

(51) Int. Cl.$^7$ ......................... G02B 26/08; G02B 26/00; G02B 6/26; H04J 14/02
(52) U.S. Cl. ....................... 359/290; 359/223; 359/224; 359/225; 359/629; 385/15; 398/82; 398/86
(58) Field of Search ........................ 359/198, 223–225, 359/290–292, 295, 298, 629; 318/15–18; 398/50, 56, 82, 86; 385/15–18

(56) References Cited

U.S. PATENT DOCUMENTS

| 4,317,611 A | 3/1982 | Petersen |
| 5,233,456 A | 8/1993 | Nelson |
| 5,552,924 A | 9/1996 | Tregilgas |
| 5,567,334 A | 10/1996 | Baker et al. |
| 5,583,688 A | 12/1996 | Hornbeck |
| 5,600,383 A | 2/1997 | Hornbeck |
| 5,914,801 A | 6/1999 | Dhuler et al. |
| 6,201,629 B1 * | 3/2001 | McClelland et al. ........ 359/223 |
| 6,249,073 B1 | 6/2001 | Nguyen et al. |
| 6,396,975 B1 * | 5/2002 | Wood et al. .................. 385/18 |
| 6,545,385 B2 | 4/2003 | Miller et al. |

OTHER PUBLICATIONS

Petersen, Kurt E., Silicon Torsional Scanning Mirror, IBMJ. Res. Dev., 24(5), 1980, pp. 631–637.
Dhuler, Vijay R., et al., A Novel Two Axis Actuator For High Speed Large Angular Rotation, Conference Record of Transducers '97, pp. 327–330, 1997.
Kiang, Meng–Hsiung, et al., Surface–Micromachined Electrostatic–Comb Driven Scanning Micromirrors For Barcode Scanners, 9$^{th}$ Annual Workshop on Micro Electro–Mechanical Systems, 1996, San Diego, CA, pp. 192–197.
Legtenberg, Rob, et al., Electrostatic Curved Electrode Actuators, MEMS, vol. 6, No. 3, pp. 257–265, Sep. 1997.

* cited by examiner

Primary Examiner—Hung Xuan Dang
Assistant Examiner—Joseph Martinez
(74) Attorney, Agent, or Firm—Brooks Kushman P.C.

(57) ABSTRACT

A low-voltage electromechanical device including a tiltable microplatform, method of tilting same and array of such devices are provided. The tiltable or steerable microplatform utilizes a bent-beam actuator to achieve large tilting angles with low actuation voltages. Thin beams of the actuator are bent in such a way as to cause the microplatform to pivot around a dimple support that generates a torsional force leading to angular motion in suspension beams attached perpendicular to the thin beams and, in turn, leading to angular or tilting motion in the suspended microplatform. Some of the key features include (1) the low-voltage bent-beam actuator; (2) a dimple-supported microplatform with a hole underneath in the substrate to allow light to pass through and to allow unhindered tilting of the microplatform; and (3) a method for constructing a microprism on the tiltable transparent microplatform for color dispersion purposes in an adaptive vision system.

31 Claims, 5 Drawing Sheets

LOW-VOLTAGE ELECTROMECHANICAL DEVICE INCLUDING A TILTABLE MICROPLATFORM, METHOD OF TILTING SAME, ARRAY OF SUCH DEVICES AND METHOD OF SETTING DIMPLE-TO-SUBSTRATE SPACING

CROSS-REFERENCE TO RELATED APPLICATION

This application claims the benefit of U.S. provisional application Ser. No. 60/376,639, filed Apr. 30, 2002 and entitled "Bent-Beam Actuated Steerable Microplatform," which is hereby incorporated in its entirety by reference herein.

STATEMENT REGARDING FEDERALLY SPONSORED RESEARCH OR DEVELOPMENT

This invention was made with Government support under Contract No. DAAG 55-98-1-0288, awarded by ARO MURI. The Government has certain rights in the invention.

BACKGROUND OF THE INVENTION

1. Field of the Invention

This invention relates to low-voltage electromechanical devices including a tiltable microplatform, methods of tilting same, arrays of such devices, and methods of setting dimple-to-substrate spacing.

2. Background Art

In the wake of rapid advancements in optical MEMS technology spurred by the telecommunications industry, micromechanical actuation mechanisms capable of generating plate tilt angles on the order of 10° are now commonplace. Among the various actuation strategies, vibromotor and bimorph methods stand out as some of the most voltage efficient, requiring 20V AC and 1–2 V (but with considerable power consumption), respectively, to attain tilt angles greater than 10° in large plates, often for optical scanning applications. However, actuation methods capable of low-power, low-voltage tilt actuations of plates that allow light to pass through a 3D array of elements are fewer in number and most require excessive power or voltage levels.

Torsional micromechanical devices have large application prospect especially in micro-optics areas. Traditionally, the tilting of a device is achieved via applying electrostatic force between a plate suspended over the substrate by two torsional beams and electrodes under the plate. Unfortunately, devices based on this mechanism suffer from the limitation of tilting angles because of the hindrance of the substrate and large driven voltages to overcome the mechanical torque of the supporting beams.

U.S. Pat. No. 4,317,611 and the article by K. E. Peterson entitled "Silicon Torsional Scanning Mirror," IBM J. RES. DEV., 24(5), 1980, pp. 631,637 both disclose silicon torsional micromachined mirrors wherein the mirror and torsion elements were patterned in a thin (134 microns) silicon wafer and retained the full thickness of the wafer. The structure was then bonded to a glass substrate, over a shallow well to allow room for the mirror motion. Actuation of the device was electrostatic. The mirror body was used as one electrode and the other electrodes were placed at the bottom of the well under the mirror. A narrow ridge in the well under the axis of rotation of the mirror was used to eliminate transverse motion of the structure. The manufacturing process for this device was relatively simple, requiring a single patterning step for the silicon and two patterning steps for the glass substrate. Its resonance frequency was about 15 kHz, and at resonance the angular displacement reached about 1°. The limitations of this device are related to the depth of the well. A 2 mm mirror touches the bottom of a 12.5 $\mu$m well at a displacement of 0.7° (1.4° total motion).

Nelson (U.S. Pat. No. 5,233,456), Baker et al. (U.S. Pat. No. 5,567,334), Hornbeck (U.S. Pat. No. 5,552,924), and Tregilgas (U.S. Pat. Nos. 5,583,688 and 5,600,383) have developed and patented a series of torsional mirror designs and improvements for use in deformable (or digital) mirror device (DMD) displays. These mirrors are fabricated by surface micromachining, consisting of a series of patterned layers supported by an undisturbed substrate. The DMD display uses an individual mirror at each pixel. The mirrors are therefore designed to be very small, to be operated in a bi-stable mode, and to maximize the packaging fraction on the surface of the display. To minimize the gaps between the reflecting surfaces of adjacent mirrors, the support structure and drive components are fabricated in underlying layers, requiring a multi-step deposition and patterning process.

As with the Peterson mirror, the Hornbeck mirror is designed to serve as one of the deflection electrodes, and the others are placed behind the mirror. Owing to the small size of the mirrors (about 20 $\mu$m×20 $\mu$m), high deflection angles are attainable with reasonably small gaps. These mirrors are designed for driving at low frequencies, and for significant dwell at a given angle (on or off), rather than for continuous motion, although the early development included mirrors designed for resonant operation (U.S. Pat. No. 5,233,456). A scanned display or imager requires, however, a large mirror.

U.S. Pat. No. 5,914,801 discloses a torsional structure which has a tiltable plate hung over a hole in the substrate, eliminating the tilting angle limitation. However, the voltage needed to actuate the device is still large, and the tilting angle depends on how close the acting point on the plate can be to the central axis, which may be limited by the fabrication process. In particular, the mirror body is formed from the silicon substrate, while the supports and actuators are fabricated above the mirror plane using surface micromachined polycrystalline silicon layers. (Also, V. J. Dhuler, "A Novel Two Axis Actuator for High Speed Large Angular Rotation," Conference Record of "TRANSDUCERS '97", 1997.) The mirror body is first defined using ion implantation of boron as an etch stop, and then by removal of the excess Si wafer from the back of the mirror. The supports and drive electrodes are offset from the top surface of the substrate by posts, which define the gap between the drive capacitor plates. Thus, the mirror is free to rotate unhindered by the bottom surface of a well, while the drive torque, being applied by actuators, is not limited by a requirement for a large capacitor gap. In the process, the mirror body thickness is limited by the boron implantation process, which has limited penetration depth; the disclosed mirror was 4 $\mu$m thick. The stiffness of the mirror is limited by both its size and thickness, so larger mirrors need to be thicker to avoid deformation of the mirror surface in use. For scanning applications, flexure in the mirror leads to uncertainty in the pixel size and location and distortion of the pixel shape. The implantation process also introduces stress into the mirror body, causing deformation of the reflective surface. The supports and actuators of the device are formed in a multi-step process and, as they are non-conducting, require the separate deposition and patterning of electrodes.

A 200 $\mu$m×250 $\mu$m mirror that has a frequency of 15 kHz is disclosed in M. H. Kiang, "Surface Micromachined Electrostatic Comb Driven Scanning Micromirrors for Barcode Applications," 9TH ANNUAL WORKSHOP ON MICRO ELECTRO-MECHANICAL SYSTEMS, 1996, San Diego, Calif., pp. 192–197. This mirror is made of deposited and patterned surface layers, and before use it must be first rotated out of the plane of the substrate using a comb drive and locked into position using complicated hinges. This approach obviates the problem of forming a cavity behind the mirror. However, the use of surface micromachined layers means that the structural rigidity of the micro-mirror cannot be controlled (because the thicknesses of the layers are limited to a few microns). The mirror motion is obtained by electrostatic drive applied by an actuator linked to one edge of the mirror. The motion of the mirror is restricted by the actuation mechanism.

The article by R. Legtenberg et al., "Electrostatic Curved Electrode Actuators," JMEMS, Vol. 6, No. 3, pp. 257–265, September 1997 is related to the present invention.

U.S. Pat. No. 6,249,073 discloses a flexural-mode micromechanical resonator including a non-intrusive support structure and one or more spacers in the form of dimples found on a resonator beam. The dimples determine a capacitive-transducer gap of the resonator.

U.S. Pat. No. 6,545,385 discloses a micromechanical apparatus for elevating and tilting a platform using a plurality of flexible members which, in turn, are controlled by one or more MEMS actuators.

SUMMARY OF THE INVENTION

An object of the present invention is to provide a low-voltage electromechanical device including a microplatform tiltable through relatively large angles, method of tilting same, array of such devices, and method of setting dimple-to-substrate spacing.

In carrying out the above object and other objects of the present invention, a low-voltage electromechanical device is provided. The device includes a substrate having an aperture and a microplatform. A pivotable support structure is coupled to the microplatform to suspend the microplatform over the aperture and to tilt the microplatform. A microactuator is anchored on the substrate to pivot the support structure in response to an electrical signal to thereby tilt the microplatform over the aperture.

The rotatable support structure may include a pair of pivotable suspension beams coupled on opposite sides of the microplatform to tilt the microplatform.

The device may further include at least one pivot extending between each of the suspension beams and the substrate to pivotably support the suspension beams.

Each of the suspension beams may have upper and lower surfaces, and the pivots may be formed on the lower surfaces of the suspension beams. The suspension beams may rest on the substrate by means of the pivots.

The microactuator may include a pair of bendable actuation beams and a drive electrode formed on the substrate to allow electrostatic excitation of the actuation beams to bend the actuation beams to thereby pivot the support structure.

The device may further include an insulation layer formed on the drive electrode to prevent the actuation beams from shorting the drive electrode during electrostatic pull down of the actuation beams.

The device may further include a spring support, and the microactuator may be anchored to the substrate by the spring support.

The device may further include a spring support coupled to the actuation beams to resist pull down of the actuation beams during electrostatic excitation.

The device may further include an optical element formed on the microplatform.

The optical element may be a layer having a reflective surface or may be a microprism to divide light into its color components.

The aperture may extend completely through the substrate to provide an optical path through the substrate, and the microplatform may be transparent.

The microplatform may be a low-stress nitride microplatform.

The suspension beams may be rigid polysilicon suspension beams.

The substrate may be a silicon wafer.

The actuation beams may be doped-polysilicon actuation beams which extend substantially perpendicular to the support structure.

The microactuator may include a pair of bendable actuation beams substantially perpendicularly attached to the suspension beams adjacent the pivots.

The amount of microplatform rotation may be based on strength of the electrical signal.

The amount of an actuation beam pinned to the drive electrode during electrostatic excitation may be based on strength of the electrical signal.

The actuation beams may follow a substantially parabolic path during bending thereof.

The optical element may be a lens.

The device may further include means for directing a collimated beam of light toward the optical element.

The device may further include a detector for detecting the color components.

Further in carrying out the above object and other objects of the present invention, a method for tilting a microplatform suspended over an aperture formed in a substrate by a pivotable support structure coupled to the microplatform is provided. The method includes providing a pair of bendable actuation beams on the substrate, and forcing the actuation beams to bend so that the actuation beams pivot the support structure to thereby tilt the microplatform over the aperture.

The method may further include providing a drive electrode to allow electrostatic excitation of the actuation beams, and the step of forcing may include the step of applying an electrical signal to the drive electrode to bend the actuation beams.

Still further in carrying out the above object and other objects of the present invention, an array of low-voltage electromechanical devices is provided. The array includes a substrate having a plurality of apertures and a plurality of microplatforms. A pivotable support structure is coupled to each of the microplatforms to suspend the microplatforms over their respective apertures and to tilt the microplatforms. A plurality of microactuators is anchored to the substrate to pivot the support structures in response to at least one electrical signal to thereby tilt the microplatforms over their respective apertures.

The array may further include an optical element formed on each of the microplatforms.

The array may further include a collimating lens array for directing collimated beams of light toward the optical elements.

The optical elements may be microprisms to divide the collimated beams of light into their color components.

The apertures may extend completely through the substrate to provide optical paths through the substrate, and each of the microplatforms may be transparent.

The array may further include a detector array for detecting the color components of the collimated beams of light.

Yet still further in carrying out the above object and other objects of the present invention, a method of setting a dimple-to-substrate spacing between dimples and a substrate is provided. The method includes forming a first oxide layer on a substrate, forming vias into the first oxide layer corresponding to dimple locations, and forming a second oxide layer on the first oxide layer after the step of forming the vias to set the dimple-to-substrate spacing.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIGS. 3a and 3b are side schematic views which describe the mechanism behind the bent-beam actuation wherein FIG. 3a is before application of actuation voltage $V_a$ and FIG. 3b is after the application of the actuation voltage;

DETAILED DESCRIPTION OF THE PREFERRED EMBODIMENTS

Figure 1:
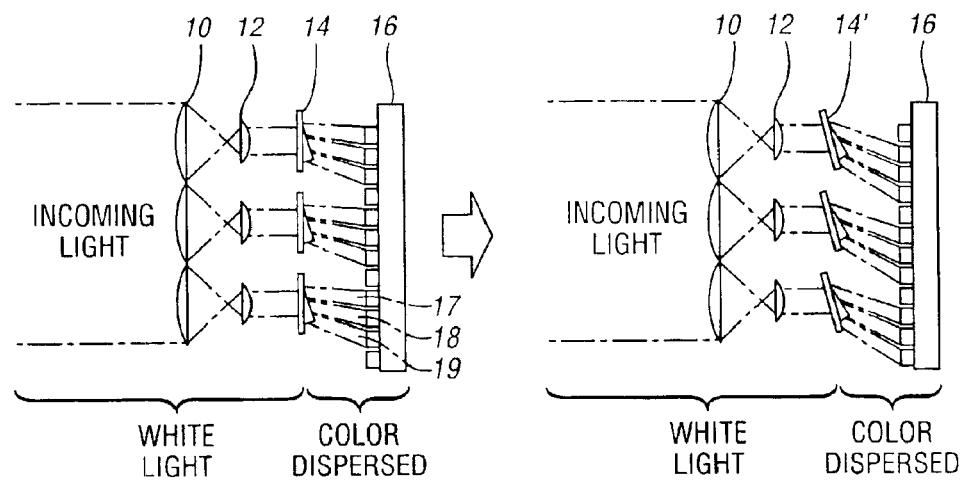
FIG. 1 is a side schematic view of a portion of an adaptive artificial vision application targeted by the tiltable microplatform of the present invention; beyond the detector array, vision algorithms are applied to the 2D data via transistor DSP circuits, then fed back to control platform tilting so as to affect color adaptation.

Referring now to FIG. 1, there is illustrated a 3D arrayed application, for which this invention is specifically targeted. An adaptive artificial vision system is depicted in FIG. 1, where incoming white light is collected by a collection lens array 10, subdivided into a 2D array, collimated by a collimating lens array 12, then directed through an array of tiltable microprisms 14, before finally reaching a pixel array or detector array 16. Reference number 14' indicates that the microprisms are tilted. In this system, the microprisms 14' disperse the color content of the incoming light, and by tilting, modulate the colors from pixel-to-pixel on the detection plane—an operation often required by algorithms for color adaptation in vision systems. Because the change in the angle of light passing through a prism is only a weak function of the prism tilt, tilt angles of 10° or greater are needed for adequate traversal of colors over adjacent pixels, and such tilts should be accomplished via low voltages and with low power consumption, as provided by the present invention.

One aspect of the present invention involves a new bent-beam electrostatic (i.e., low power) actuation method that achieves DC microplatform tilts larger than 10°, actuation voltages less than 20V and resonance tilts up to 19° at 33 kHz, while offering an implementation structure amenable to applications requiring 3D arrayed transmission-based operation, as described above with reference to FIG. 1.

Microplatform Operation

Figure 2:
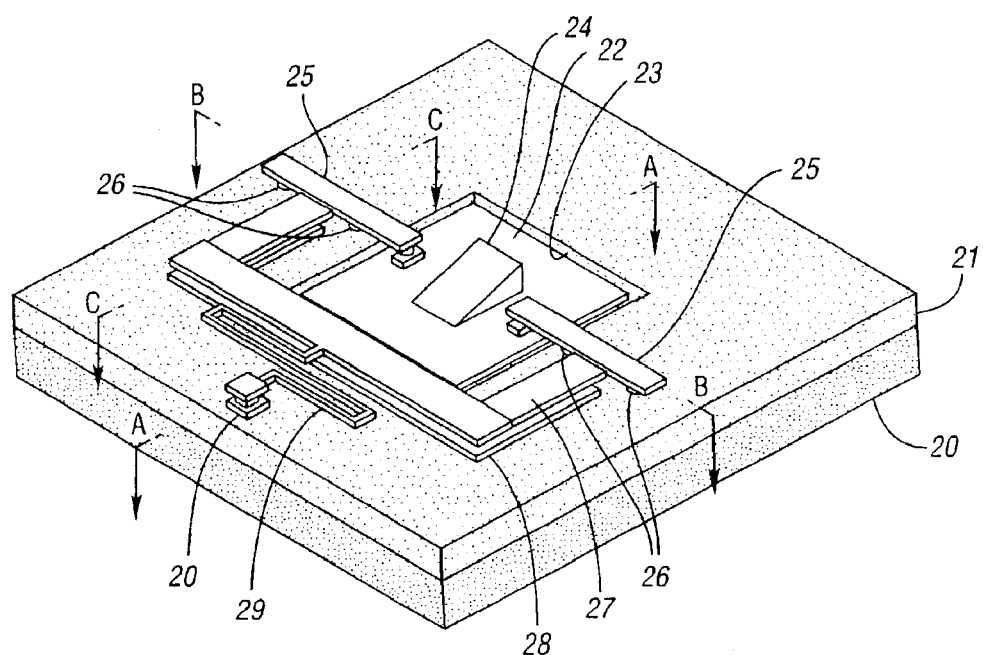
FIG. 2 is a perspective schematic view of a bent-beam actuated tiltable microplatform of the present invention.

FIG. 2 presents a perspective view schematic of a tiltable microplatform 22 supporting or housing a microprism 24. As shown, the low-stress nitride microplatform 22 itself is suspended via rigid polysilicon suspension beams 25 above a hole 23 in the substrate having a silicon base 20 and a thermal oxide layer 21 (as well as nitride over the layer 21 to prevent etching of the oxide 21 during release of the structures) that: (1) allows light to pass through; and (2) allow unimpeded tilting of the microplatform 22 over very large angles. The suspension beams 25 are not anchored to the substrate directly, but rather rest upon the substrate via strategically-placed dimples or pivots 26, around which the suspension beams 25 can pivot to affect tilting of the platform 22. These pivoting suspension beams 25 together with the network of beams attached to them, such as actuation beams 27 (electrostatically-excited by an actuation electrode 28), then realize the bent-beam actuation mechanism that makes possible tilting of the platform 26 at such low voltages.

Figure 3A:
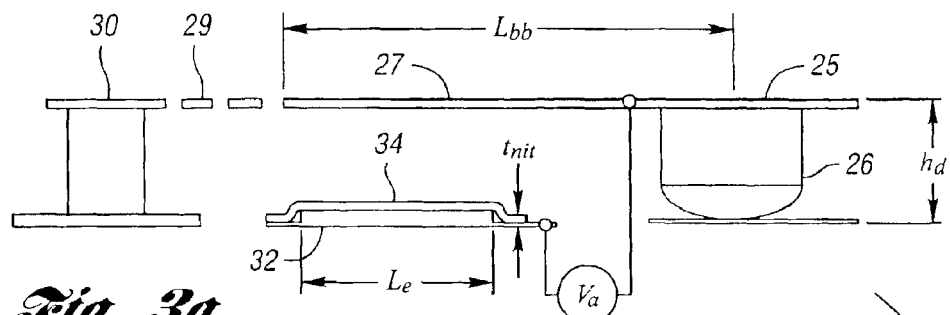
Figure 3B:
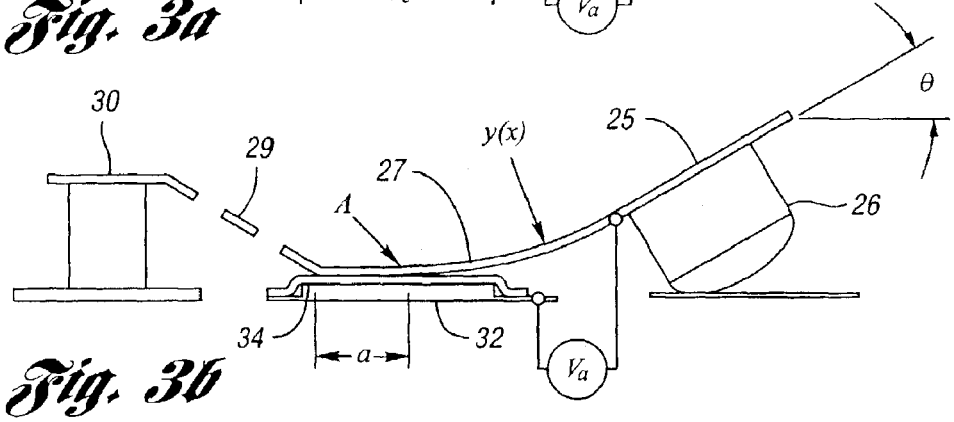

As illustrated in FIGS. 3a and 3b, bent-beam actuation is achieved by pulling down the thin, doped-polysilicon actuation beams 27 perpendicularly attached to the suspension beams 25. The thin beams 27 bend close to the suspension dimples 26 so as to pivot the suspension beams 25 around an angle defined by the degree of bending in the thin actuation beams 27. The thin beams 27 are pulled down electrostatically by applying a suitable voltage to an underlying, nitride-covered (to prevent shorting), doped-polysilicon electrode 32 (i.e., covered by an insulation layer 34). The voltage required to achieve a given angle is greatly reduced in this system because: (1) the pivoting dimples 26 eliminate the need to overcome a torsional stiffness; and (2) once pulled down, portions of the beams 27 near the bend are very close to the underlying electrode 32 so the electrostatic beam-bending force is larger for a given voltage.

FIGS. 3a and 3b are schematic views, and it is to be understood that the nitride (or dielectric) layer 34 over the electrode 32 is conformed over the electrode 32 itself including the corners of the electrode 32.

Bent-Beam Actuator Design

To obtain an expression for tilt angle as a function of applied actuation voltage for a bent-beam actuator, an energy method is used in which the derivative of the total potential energy in the system with respect to distance is set to zero at equilibrium.

Using this technique, neglecting fringing electric fields and dimple-to-substrate friction, the voltage required to pin the bending beams 27 up to the point A in FIG. 3b can be derived and written as:

$$V_a(a) = \sqrt{\frac{(12 h_d^2 EI)/(L_{bb} - a)^4}{\frac{\varepsilon_{nit}\varepsilon_o W_{bb}}{t_{nit}} + \frac{\varepsilon_o W_{bb} \delta z(a)}{\delta a}}} \quad (1)$$

where $$z(a) = (L_{bb} - a)\sqrt{\frac{\varepsilon_{nit}}{h_d t_{nit}}} \cdot \mathrm{atan}\left[(L_e - a)\sqrt{\frac{\varepsilon_{nit} h_d}{t_{int}(L_{bb} - a)^2}}\right] \quad (2)$$

and where $L_{bb}$ and $W_{bb}$ are the length and the width, respectively, of the bending beam, $L_e$ is the length of the actuation electrode, α is the electrode-to-beam contact length when the bending beam is pinned to the substrate, $h_d$ is the height of the dimple, $t_{nit}$ is the thickness of the insulation layer, E is the Young's modulus of polysilicon, 1 is the bending moment of the bending beam, $\epsilon_{nit}$ is the dielectric constant of the insulation layer, and $\epsilon_0$ is the permittivity of free space. Using (1) to determine the distance α generated by a given voltage $V_\alpha$, the tilt angle can then be determined via the expression:

$$\theta(a) = a\tan\left[\frac{dy(x)}{dx}\right]\bigg|_{x=L_{bb}} = a\tan\left[\frac{2h_d}{L_{bb} - a}\right] \quad (3)$$

where y(x) is the deflection of the beam, approximately parabolic.

Fabrication Process

Figure 4A:
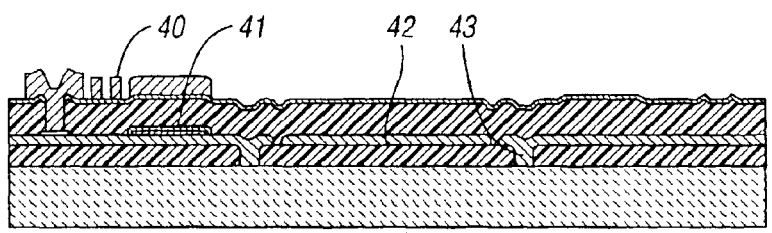
FIGS. 4a–4c are general, tiltable microprism/microplatform process flow sectional views taken along lines a—a, b—b and c—c, respectively, of FIG. 2 at a point just before prism processing.
Figure 4B:
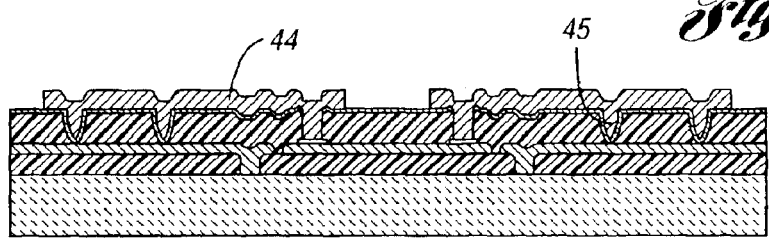
Figure 4C:
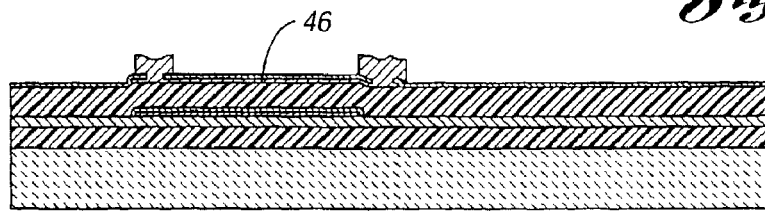

The fabrication process for the tiltable microplatform combines surface micromachining with deep RIE and phased lithography, and is very briefly summarized in FIGS. 4a–4c and FIGS. 5a–5c. Referring first to FIGS. 4a–4c, the process begins with the growth of a 2 μm thermal oxide insulation layer (i.e., 21 in FIG. 2), which is patterned to form sealant vias 43 that later prevent etching of the isolation layer during a final HF release etch step. 1 μm of silicon rich (low stress) LPCVD nitride is then deposited at 835° C. to fill the sealant vias 43 and to serve as the structural material for the eventual microplatform 42. Next, 3000 Å of LPCVD polysilicon is deposited at 588° C., then POCl$_3$-doped and patterned to form electrodes 41 and electrical interconnect. An 1800 Å layer of stoichiometric nitride is then deposited and patterned over the patterned polysilicon to serve as an insulation layer that prevents shorting between the actuation electrodes 41 and suspended polysilicon structures. The platform nitride is then patterned and covered by a 3.3 μm-thick LPCVD high temperature oxide (HTO) layer (i.e., 62 in FIG. 6a), deposited at 920° C., that sets the gap spacing between the actuation electrodes 41 and the bending beams 46. Next, 3000 Å of LPCVD polysilicon is deposited at 588° C., then doped and patterned to form the bending beams 46.

At this juncture, dimple molds are formed by first RIE'ing vias corresponding to dimple locations into the thick sacrificial oxide, then blanket depositing a 1500 Å-thick spacer layer of HTO that effectively sets the dimple-to-substrate spacing. This method for forming dimples 45 eliminates the need for the timed etch needed in a dimple-formation process disclosed in U.S. Pat. No. 6,249,073, and greatly enhances the accuracy to which the dimple-to-substrate gap spacing can be set.

Openings are then etched via RIE into the thin HTO layer above the bending beams 46 and into the thick HTO layer in the field to form attachments between the bending beams 46 and the thicker structural layer making up the platform suspension beams 44 and spring support 40, and to form an anchor to the substrate for the spring support 40. This is the only point rigidly attached to the substrate. The thick structural features are then formed via a 2 μm-thick LPCVD, low-stress polysilicon deposition at 588° C., followed by subsequent doping and patterning to form the suspension beams 44 and spring support 40, and yielding the cross sections of FIGS. 4a–4c (i.e. with reference to FIG. 2).

Figure 5A:
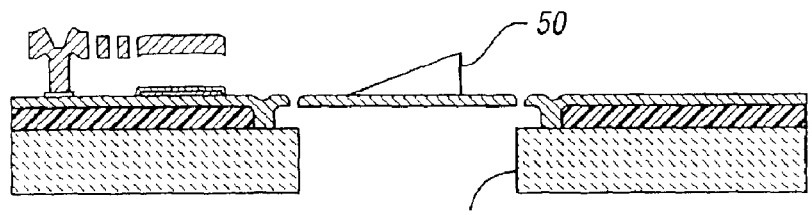
FIGS. 5a–5c are similar to the views of FIGS. 4c—4c, respectively, at the end of the process.
Figure 5B:
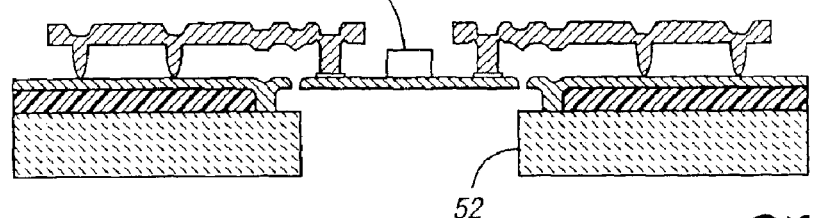
Figure 5C:
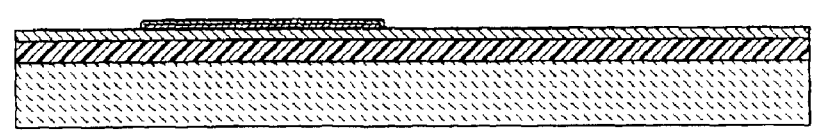
Figure 6A:
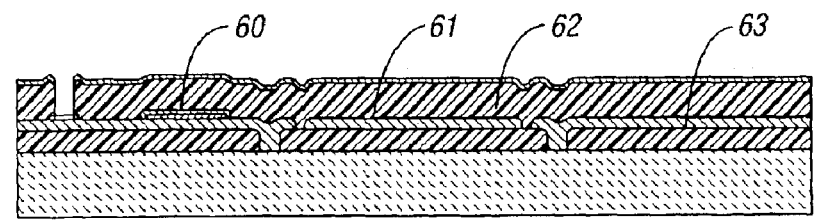
FIGS. 6a–6c.
Figure 6B:
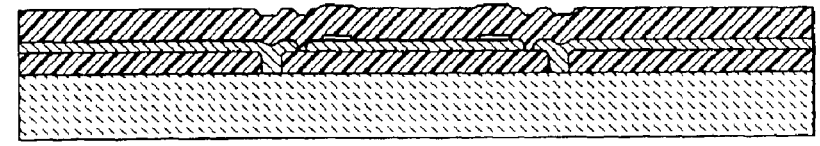
Figure 6C:
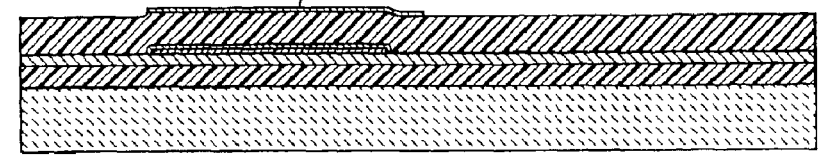

Referring now to FIGS. 5a–5c, to form the photoresist microprism 50 on the microplatform 42, HTO is first removed over the microplatform 42, and a 2.7 μm-thick photoresist layer (AZ1800 series) is spun on. The microprism 50 is then delineated by exposing the photoresist through a gray-scale mask that affects a linear variation in exposure intensity over the prism area, effectively exposing a triangular shaped cut into the photoresist thickness. A subsequent development step then removes all exposed photoresist, leaving behind a photoresist microprism 50.

To allow the passage of light through the microprism 50, a through-wafer hole 52 is etched from the back side of the wafer using the Bosch process before release. The release etch is finally done using 48.8 wt % concentrated HF, followed by a supercritical $CO_2$ drying step to minimize sticking, yielding the cross sections of FIGS. 5a–5c, where three levels of suspension—nitride platform, bending beams, and suspension beams—have been achieved in a single planar process.

Table 1 summarizes the design parameters for one device constructed using the teachings of the present invention.

TABLE 1

BENT-BEAM ACTUATED MICROPLATFORM DESIGN

| PARAMETER | VALUE | UNITS |
|---|---|---|
| Microplatform Size | 100 × 90 | μm |
| Bending Beam Length, $L_{bb}$ | 94 | μm |
| Bending Beam Width, $W_{bb}$ | 18 | μm |
| Bending Beam Thickness, $h_{bb}$ | 0.3 | μm |
| Actuation Electrode Length, $L_e$ | 83 | μm |
| Dimple Height, $h_d$ | 3.45 | μm |
| Electrode Dielectric Thickness, $t_{nit}$ | 0.18 | μm |
| Polysilicon Young's Modulus, E | 150 | GPa |

An electrostatic bent-beam actuated tiltable microplatform fabricated using a combined surface micromachining and deep RIE technology has been demonstrated with a measured maximum tilt angle and resonance frequency of 19° and 33 kHz, respectively, obtained using a voltage combination of 14V DC and 5V amplitude AC. Given that the described bent-beam actuation technique is largely electrostatic in nature, the tilt angle-to-voltage/power ratio achieved by the above values represents one of the largest available using MEMS technology, and the numbers demonstrated here can even be bettered by reducing bending beam thicknesses. This, combined with an implementation structure conducive to transmission-based optical signal processing, makes bent-beam actuation a good candidate for 3D arrayed adaptive vision applications.

FIGS. 6a–6c, 7a–7c, 8a–8c, 9a–9c and 10a–10c illustrate in greater detail than FIGS. 4a–4c and 5a–5c the process flow. The fabrication combines the surface micromachined LPCVD-based process and the deep RIE. The whole device is fabricated on a 4-inch silicon wafer.

As shown in FIGS. 6a–6c, 2 μm thermal oxide 63 is grown on the wafer as an isolation layer. Next, 1 μm low stress nitride is deposited as the microplatform 61 material which guarantees the flatness of the structure. 0.3 μm polysilicon is then deposited, patterned and etched to form the lower actuation electrodes 60, which is then covered by a thin layer of nitride as the insulation layer. The platform 61 is then defined by an etching step. Next, a 3.3 μm HTO sacrificial layer 62 is deposited, followed by a 0.3 μm polysilicon deposition, patterning and etching procedure which forms the actuation beams 64.

Figure 7A:
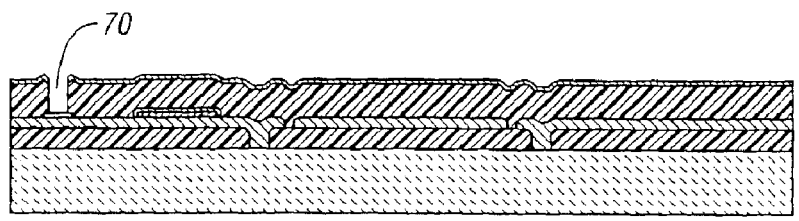
FIGS. 7a–7c.
Figure 7B:
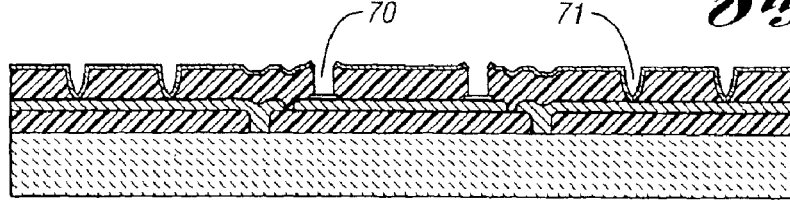
Figure 7C:
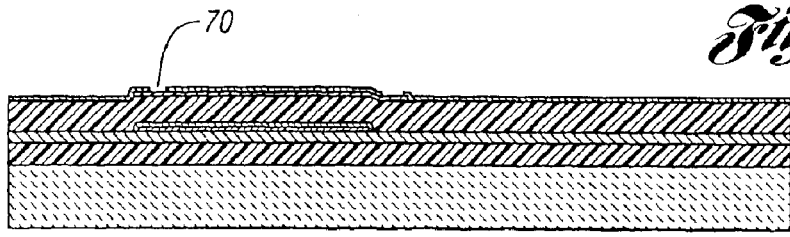

Referring now to FIGS. 7a–7c, small openings 71 for dimples in the sacrificial layer are then etched followed by a thin layer of oxide deposition. By this way of making dimples, timed-etch is avoided. Another etch in the thin oxide layer is performed to open anchors 70 for the actuation spring supports and the suspension beams connecting to the actuation beams. Again, an etch step is followed to form the anchors for, spring supports connecting to the substrate and suspension beams connecting to the platform.

Figure 8A:
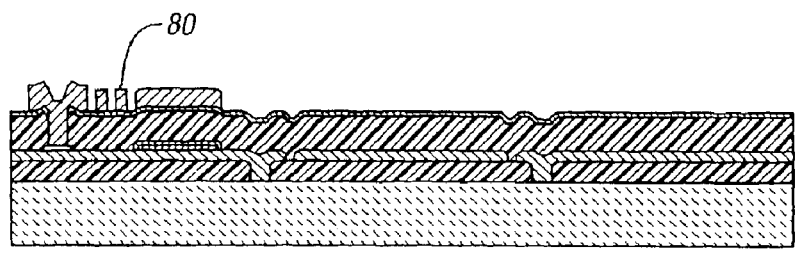
FIGS. 8a–8c.
Figure 8B:
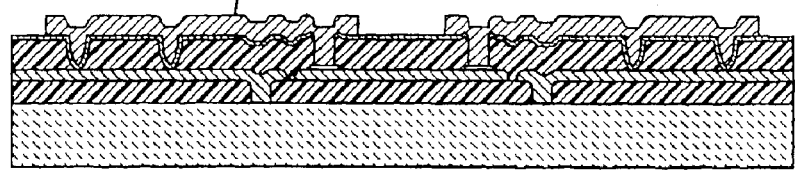
Figure 8C:
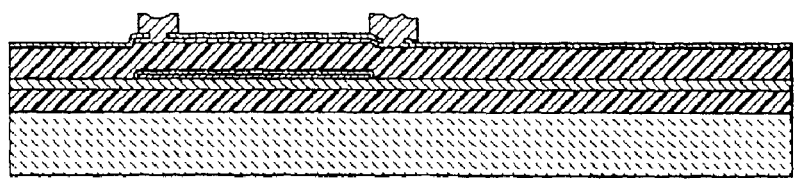

Referring now to FIGS. 8a–8c, after that, 2 μm polysilicon is deposited, patterned, and etched which serves as the spring supports 80 and the suspension beams 81.

Figure 9A:
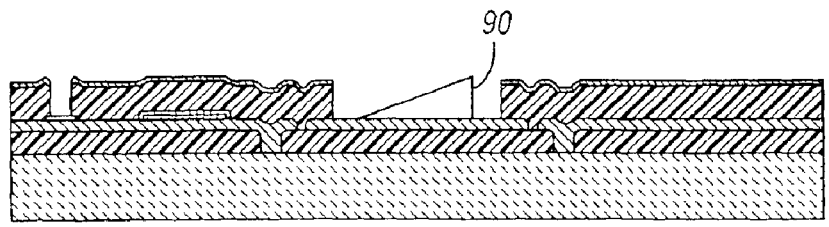
FIGS. 9a–9c.
Figure 9B:
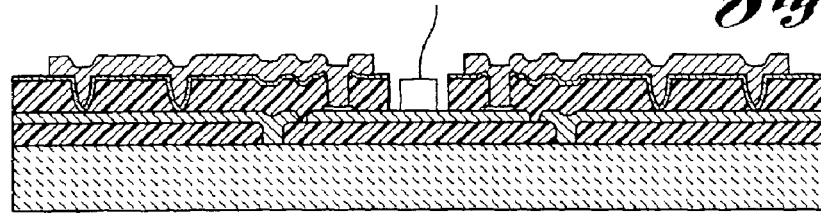
Figure 9C:
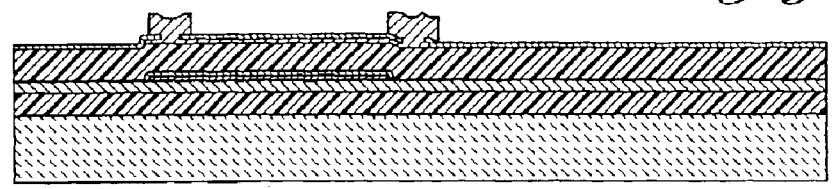

Referring now to FIGS. 9a–9c, a microprism fabrication step is performed to fabricate a microprism 90 on top of the microplatform as previously described.

Figure 10A:
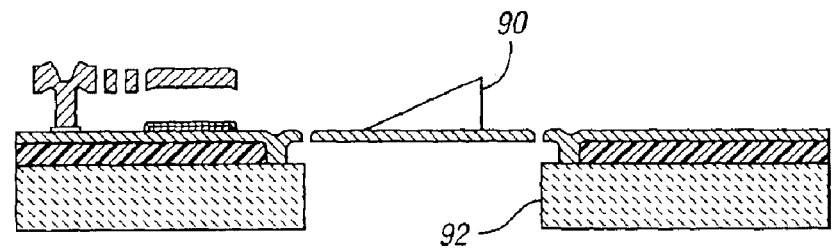
FIGS. 10a–10c are detailed tiltable microprism/microplatform process flow sectional views taken along lines a—a of FIG. 2 (i.e., FIGS. 6a, 7a, 8a, 9a and 10a), lines b—b of FIG. 2 (i.e., FIGS. 6b, 7b, 8b, 9b and 10b), and lines c—c of FIG. 2 (i.e., FIGS. 6c, 7c, 8c, 9c and 10c).
Figure 10B:
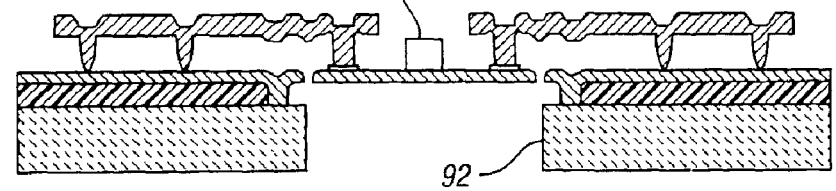
Figure 10C:
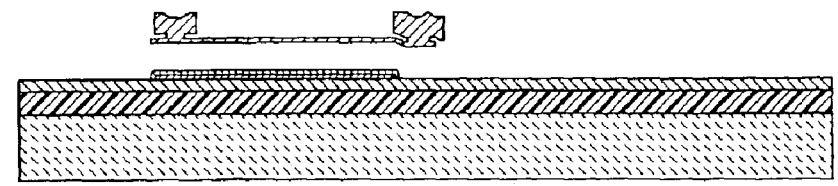

Referring now to FIGS. 10a–10c, having finished the process on the front side of the wafer, a hole 92 is etched through from the back side of the wafer by a deep silicon etching tool (STS). Finally, the structure is released in HF to yield the final cross sections shown in FIGS. 10a–10c.

While the microprism 24 is described as a photoresist microprism, the microprism 24 may be a nitride or $TiO_2$ microprism.

Also, referring to FIGS. 5b and 10b, the dimples are shown therein as touching the top low stress nitride on the substrate. The dimples come down and touch after release.

Some Benefits of the Invention

Some of the main advantages and contributions of this invention are:

(i) A method and apparatus for large-angle tilting a microplatform using low actuation voltages.

(ii) A device that can be applied to the micro-optics field. The device can serve as a micromirror if the surface of the microplatform is coated with reflective materials. In addition, it can be used as a tiltable micro-optical platform with other micro-optical elements on top, such as a microprism. This, combined with wafer bonding techniques, is suitable for three-dimensional micro-optical system architectures.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A low-voltage electromechanical device comprising:
   a substrate having an aperture;
   a microplatform;
   a pivotable support structure having a torsional stiffness and coupled to the microplatform to suspend the microplatform over the aperture and to tilt the microplatform; and
   a microactuator anchored on the substrate to pivot the support structure in response to a low-voltage electrical signal to thereby tilt the microplatform over the aperture wherein the support structure is not directly anchored to the substrate and wherein the device further comprises at least one pivot around which the support structure pivots to affect tilting of the microplatform in response to the low-voltage electrical signal while eliminating the need to overcome the torsional stiffness of the support structure.

2. The device as claimed in claim 1, wherein the support structure includes a pair of pivotable suspension beams coupled on opposite sides of the microplatform to tilt the microplatform.

3. The device as claimed in claim 2, wherein the at least one pivot extends between each of the suspension beams and the substrate to pivotably support the suspension beams.

4. The device as claimed in claim 3, wherein each of the suspension beams has upper and lower surfaces and wherein the pivots are formed on the lower surfaces of the suspension beams and wherein the suspension beams rest on the substrate by means of the pivots.

5. The device as claimed in claim 3 wherein the microactuator includes a pair of bendable actuation beams substantially perpendicularly attached to the suspension beams adjacent the pivots.

6. The device as claimed in claim 2 wherein the suspension beams are rigid polysilicon suspension beams.

7. The device as claimed in claim 1, wherein the microactuator includes a pair of bendable actuation beams and a drive electrode formed on the substrate to allow electrostatic excitation of the actuation beams to bend the actuation beams to thereby pivot the support structure.

8. The device as claimed in claim 7, further comprising an insulation layer formed on the drive electrode to prevent the actuation beams from shorting the drive electrode during electrostatic pull down of the actuation beams.

9. The device as claimed in claim 8, further comprising a spring support coupled to the actuation beams to facilitate pull down of the actuation beams during electrostatic excitation.

10. The device as claimed in claim 7, wherein the actuation beams are doped-polysilicon actuation beams which extend substantially perpendicular to the support structure.

11. The device as claimed in claim 7 wherein amount of an actuation beam pinned to the drive electrode during electrostatic excitation is based on strength of the electrical signal.

12. The device of claim 7 wherein the actuation beams follow a substantially parabolic path during bending thereof.

13. The device as claimed in claim 1, further comprising a spring support wherein the microactuator is anchored to the substrate by the spring support.

14. The device as claimed in claim 1, further comprising an optical element formed on the microplatform.

15. The device as claimed in claim 14, wherein the optical element is a layer having a reflective surface.

16. The device as claimed in claim 14, wherein the optical element is a microprism to divide light into its color components.

17. The device as claimed in claim 16, wherein the aperture extends completely through the substrate to provide an optical path through the substrate and wherein the microplatform is transparent.

18. The device as claimed in claim 17 further comprising a detector for detecting the color components.

19. The device of claim 14 wherein the optical element is a lens.

20. The device as claimed in claim 14 further comprising means for directing a collimated beam of light toward the optical element.

21. The device as claimed in claim 1 wherein the microplatform is a low-stress nitride microplatform.

22. The device as claimed in claim 1 wherein the substrate is a silicon wafer.

23. The device as claimed in claim 1 wherein amount of microplatform rotation is based on strength of the electrical signal.

24. A method for tilting a microplatform suspended over an aperture in a substrate by a pivotable support structure having a torsional stiffness and coupled to the microplatform but not directly anchored to the substrate, the method comprising:
   providing at least one pivot;
   providing a pair of bendable actuation beams on the substrate; and
   forcing the actuation beams to bend so that the actuation beams pivot the support structure around the at least one pivot to thereby tilt the microplatform over the aperture wherein the at least one pivot permits pivoting movement of the support structure relative to the substrate while eliminating the need to overcome the torsional stiffness of the support structure.

25. The method as claimed in claim 24 further comprising:

providing a drive electrode to allow electrostatic excitation of the actuation beams and wherein the step of forcing includes the step of applying an electrical signal to the drive electrode to bend the actuation beams.

26. An array of low-voltage electromechanical devices, the array comprising:

a substrate having a plurality of apertures;

a plurality of microplatforms;

a pivotable support structure having a torsional stiffness and coupled to each of the microplatforms to suspend the microplatforms over their respective apertures and to tilt the microplatforms; and a plurality of microactuators anchored to the substrate to pivot the support structures in response to at least one low-voltage electrical signal to thereby tilt the microplatforms over their respective apertures wherein each of the support structures is not directly anchored to the substrate and wherein the array further comprises a plurality of pivots around which the support structures pivot to affect tilting of the microplatforms in response to the at least one low-voltage electrical signal while eliminating the need to overcome the torsional stiffness of the support structures.

27. The array as claimed in claim 26 further comprising an optical element formed on each of the microplatforms.

28. The array as claimed in claim 27 further comprising a collimating lens array for directing collimated beams of light toward the optical elements.

29. The array as claimed in claim 28 wherein the optical elements are microprisms to divide the collimated beams of light into their color components.

30. The array as claimed in claim 29 wherein the apertures extend completely through the substrate to provide optical paths through the substrate and wherein each of the microplatforms is transparent.

31. The array as claimed in claim 30 further comprising a detector array for detecting the color components of the collimated beams of light.

* * * * *